(12) United States Patent
Henn

(10) Patent No.: US 7,073,561 B1
(45) Date of Patent: Jul. 11, 2006

(54) SOLID FREEFORM FABRICATION SYSTEM AND METHOD

(76) Inventor: David S. Henn, 13705 Northwest Ct., Haslet, TX (US) 76052

( * ) Notice: Subject to any disclaimer, the term of this patent is extended or adjusted under 35 U.S.C. 154(b) by 0 days.

(21) Appl. No.: 10/988,821

(22) Filed: Nov. 15, 2004

(51) Int. Cl.
*B22D 23/00* (2006.01)

(52) U.S. Cl. ........................................ 164/94; 164/271

(58) Field of Classification Search .................. 164/94, 164/271, 155.1, 155.4
See application file for complete search history.

(56) References Cited

U.S. PATENT DOCUMENTS 5,169,579 A * 12/1992 Marcus et al. ................ 264/81
5,306,447 A * 4/1994 Marcus et al. .............. 264/497
5,960,853 A * 10/1999 Sterett et al. ................ 164/271
6,405,095 B1 * 6/2002 Jang et al. ................... 700/118
2004/0188053 A1 * 9/2004 Brice .......................... 164/80

* cited by examiner

*Primary Examiner*—Len Tran
(74) *Attorney, Agent, or Firm*—Dan Brown Law Office; Daniel R. Brown (57) ABSTRACT

A system and method of solid freeform work piece fabrication through layered deposition of feedstock material on a mold structure. An energy beam and feedstock are fed to a feed point adjacent to a mold structure, thereby forming a molten puddle. The feed point is moved relative to the mold structure, thereby advancing the molten puddle of presently fed feedstock and rapidly solidifying previously fed feedstock. The feed point is sequentially advanced within a predetermined geometric volume containing at least a portion of the mold structure, thereby sequentially fusing the feedstock, by action of the advancing molten puddle, into a near net shape work piece built-up upon the mold structure.

35 Claims, 8 Drawing Sheets

SOLID FREEFORM FABRICATION SYSTEM AND METHOD

BACKGROUND OF THE INVENTION

1. Field of the Invention

The present invention relates to solid material fabrication. More specifically, the present invention relates to solid freeform fabrication through feedstock deposition using an energy beam and advancing a molten puddle of rapidly solidifying material layered upon a mold or base structure.

2. Description of the Related Art

Metal and composite part fabrication and utilization permeates modern industry. An enormous range of products incorporate such parts, which may range in size from tiny components to major structural elements of huge machines. Industry has developed a wide range of fabrication techniques for such parts, which address materials, costs, development time, and economies of production. Among these fabrication techniques are casting, forging, machining, stamping, assemblies, and additive manufacturing.

The casting process essentially consists of making a shaped mold, and then pouring or injecting liquid material into the mold followed by relatively slow cooling of the entire mold with the desired part solidifying therein. As compared to other part fabrication techniques casting typically yields weaker parts due to the affects of cooling, which causes the material microstructure to be less dense. Pores and voids within the part are also problematic to this process since the process can introduce pockets of gas bubbles into the casting. Casting is sometimes used for more complex part geometries where strength is not the highest priority. Castings are also limited by the choices of materials that may be cast due to cooling rate issues. The trend in casting technology is to utilize investment casting where the initial mold is destroyed during the creation of the part. This allows much more complex or unitized parts to be built, however, cost increases as compared to reusable molds because the mold must be recreated for each part produced.

The forging process today is essentially unchanged from the ancient art of blacksmithing. A metal material is heated until it becomes pliable, and then force is exerted on the material using a tool. Modern forges can produce a great deal of force. The forging process is limited to relatively non-complex parts. Part overhang areas, closed regions, and complex vertical surfaces cannot be fabricated using the forging process. Although there have been advances in controlling the temperature of the stock material and advances in using shaped tools, tremendous amounts of energy are required to bring a large billet to temperature before a forging tool can shape it. A forging operation generally requires a large capital investment and long lead times for tool fabrication. Additionally, creating custom tools for closed die forging is expensive and once the tool is fabricated, it cannot be changed without considerable expense and delay.

The machining process is one of the largest segments in the manufacturing industry. With machining, essentially a block or raw materials is drilled, cut and milled to reveal the desired part within. Typically, rolled billet material is used as the raw stock in machining operations. Machining operations are time consuming and material consumption inefficient. For instance, some aerospace industry machined parts can begin as 1400 kilogram billets of material, which are machined to a final part having net weight of perhaps 45 kilograms. This yields a 30:1 scrap ratio. Recent improvements in the machining industry have focused on high-speed machining operations. This has improved the cost of machined parts, but the capital investment in purchasing new machines has kept supplier competition down and prices high. Issues with gouging and cutter longevity are problematic and are still being addressed in the industry.

Part fabrication by stamping operations and assemblies of plural stamped parts are heavily used in the aerospace and automotive sectors. This approach produces many smaller, thin, and relatively simple shapes that are be assembled together by welding or by using mechanical fasteners. Small assemblies are then combined into larger assemblies until the structure is complete. An aircraft fuselage and automobile chassis are examples of these assembly techniques. These are labor-intensive approaches that add weight and complexity due to redundant structure and fasteners. The current industry trend is to produce unitized structures where multiple parts are designed and fabricated as one part.

Additive manufacturing is a relatively recent development. For example, Aeromet Manufacturing, in Eden Prairie Minn., has developed a process it calls "Laser Additive Manufacturing." This process applies a powdered feedstock that is melted into a molten puddle using laser energy. Powder is added and the laser directed to build a part up with multiple layers. Parts are built up on a base plate of the same material as the powder and can be built up to near net shape of the final part. As such, the amount of machining required is substantially less than billet-machined parts. Similarly, Optomec, Inc. of Albuquerque, N. Mex. has commercialized a process called "Laser Engineered Net Shape" that also uses a laser heat source and a powdered filler material. Prior art additive systems are limited in deposition rates to about 15 $cm^3$ per hour. While these systems yield good results for small parts, the inefficient power consumption of laser power sources and low deposition rates make them impractical of larger part fabrication projects. With respect to scaling these processes, the upper limit is probably in the 500 $cm^3$ per hour, or lower, range. Additive manufacturing has increased flexibility in part production, however, size is limited and finish machining operation carry many of the same limits as machined parts.

Certain systems and products require high quality parts that can be produced in relatively small quantities. In these arenas, design flexibility and short turn-around times are important. Complex parts are often required, which may include overhangs, cavities, bores, bosses, slots, complex curvatures, or other design subtleties. Exotic alloys are frequently employed, which are expensive as raw material and are difficult to machine. While the list of such applications is vast, here are a few example applications.

Aerospace Industry
Titanium and Aluminum Components
High Strength Complex Parts
Space Station or Deep Space Mission Applications
Lightweight Metal Alloy Innovations
Jet Engine Components
Missile Manufacturing
Automotive Industry
High Strength Aluminum Bodies
Prototype Engine Blocks
Auto Racing Industry
Oil and Gas Industry
Drill Bit Applications
Pumping Technology
Chemical Processing Industry
Corrosive Material Handling
Complex Shaped Manifolds, Fluid Handling Parts
Shipbuilding Industry Propeller Development
Components Exposed to Harsh Environments
Military Hardware
High Temperature Gun Barrels
Light Weight Tank Armor
Complex Shaped Penetrating Bomb Casings
High Hardness Materials Used for Bunker-Buster Applications
Fléchette and Sabo Projectiles
Nuclear Industry
Exotic Materials Fabrication
Tool Making Industry
High Temperature, High Wear Applications
Medical Implants and Prosthetics Thus it can be appreciated that there is a need in the art for a system and method of fabricating solid freeform parts having the qualities and advantages of casting, the strength of forgings, the flexibility of machining, and the raw material advantages of near net shape deposition techniques.

SUMMARY OF THE INVENTION

The need in the art is addressed by the systems and methods of the present invention. A method of solid freeform work piece fabrication through layered deposition of feedstock material on a mold structure is taught. The method includes the steps of directing an energy beam and feeding feedstock to a feed point adjacent to the mold structure, thereby forming a molten puddle. Further, moving the feed point relative to the mold structure, thereby advancing the molten puddle of presently fed feedstock and rapidly solidifying previously fed feedstock, and, sequentially advancing the feed point within a predetermined geometric volume containing at least a portion of the mold structure, thereby sequentially fusing the feedstock, by action of the advancing molten puddle, into a near net shape work piece built-up upon the mold structure.

In a specific embodiment, the moving step includes rotating the mold. In another embodiment, the mold is fabricated from a material selected from one of; a composite matrix, a metal having a melting point substantially higher than the melting point of the feedstock, boron nitride, an inorganic compound, and graphite. In another embodiment, the method includes the further step of separating the mold from the work piece. The separating step may be accomplished by disintegrating the mold or dissolving the mold. In another specific embodiment of the method, the energy beam is selected from one of; an electron beam, an ion beam, a plasma beam, a flame spray, a gas tungsten beam, a metal arc, a gas metal arc, a microwave beam, a radio frequency beam, tungsten-inert gas beam, a metal-inert gas beam, and a laser beam. In refinements to the method, it further includes the steps of focusing the energy beam on the feed point or scanning the energy beam about the feed point.

In a specific embodiment of the foregoing method, wherein the energy beam is driven by a power supply, the method includes the further step of coupling the power supply to the feedstock at the feed point. In another embodiment, the method is carried out in a vacuum. The feedstock may be a powder or a wire, and may include the further step of feeding out the wire feedstock in coordination with the moving step. The feedstock may be selected from; aluminum, an aluminum alloy, titanium, a titanium alloy, a tool steel, a carbon nanotube compound, a composite matrix, a super abrasive compound.

The present invention also teaches a solid freeform fabrication system employing layered deposition of feedstock material on a mold to produce a net or near net shape work piece. The system includes a mold support and a feed means that feeds the feedstock material to a feed point adjacent to the mold. An energy beam producing means operates to direct an energy beam to the feed point, thereby forming a molten puddle of feedstock material. A movement means is coupled to the mold support, and operates to move the feed point relative to the mold. A controller controls movement of the movement means to advance the molten puddle of feedstock, which also rapidly solidifies previously fed feedstock. This action sequentially advances the feed point within a predetermined geometric volume containing part of the mold, thereby sequentially fusing the feedstock, by action of the advancing molten puddle, into the net or near net shape work piece built-up upon the mold.

In a specific embodiment of the foregoing system, the movement means is controllable to rotate the feed point about the mold. In another embodiment, the movement means is controllable to move the feed point within a three-dimension coordinate space. In particular embodiments, the mold is fabricated from a material selected from one of; a composite matrix, a metal having a melting point substantially higher than the melting point of the feedstock, boron nitride, an inorganic compound, and graphite. In specific embodiments, the mold structure is separable from the work piece by disintegration of the mold structure or dissolving the mold structure.

In a specific embodiment of the foregoing system, the energy beam producing means is selected from one of; an electron beam, an ion beam, a plasma beam, a flame spray, a gas tungsten beam, a metal arc, a gas metal arc, a microwave beam, a radio frequency beam, tungsten-inert gas beam, a metal-inert gas beam, and a laser beam. The controller may operate to control the energy beam producing means to focus the energy beam on the feed point. The controller also may operate to control the energy beam producing means to scan the energy beam about the feed point.

In another specific embodiment, the system further includes a power supply coupled to the energy beam producing means, wherein the power supply is electrically coupled to the feedstock at the feed point. In another embodiment, the system includes a housing for enclosing the mold support, the feed means, the energy beam producing means, and the movement means. Thus, the housing is substantially evacuated during fabrication of the work piece. In other embodiments, the feedstock is a powder or a wire. In the case of wire feedstock, the controller operates to control the feed means to feed out the wire feedstock in coordination with the movement means. The feedstock may be selected from one of, aluminum, an aluminum alloy, titanium, a titanium alloy, a tool steel, a carbon nanotube compound, a composite matrix, a super abrasive compound.

The present invention also teaches a solid freeform fabrication system employing layered deposition of feedstock on a mold to produce a net or near net shape work piece. This system includes a mold support and a boron nitride mold coupled thereto. Also, a feed means operable to feed titanium alloy wire feedstock to a feed point adjacent to the mold. An electron beam gun operates to focus an electron beam to the feed point, thereby forming a molten puddle of the feedstock. A power supply is coupled to the electron gun, and is also electrically coupled to the feedstock at the feed point. A movement means is coupled to the mold support, and operates to move the feed point within a three dimension coordinate space relative to the mold. A controller is coupled to control movement of the movement means to advance the molten puddle of presently fed feedstock, which also rapidly solidifies previously fed feedstock. This the controller sequentially advances the feed point within a predetermined geometric volume containing at least a portion of the mold, thereby sequentially fusing the feedstock, by action of the advancing molten puddle, into the net or near net shape work piece built-up upon the mold. The controller also operates to control the feed means to pays out the wire feedstock in coordination with the movement means. A housing encloses the mold support, the feed means, the electron gun, and the movement means. A vacuum pump evacuates the housing during fabrication of the work piece.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The present invention teaches a revolutionary advancement in the state of the art for solid freeform fabrication. An illustrative embodiment of the present invention system and method uses an electron beam as the heat source and wire as the feedstock material in the production of large, complex shape, metal parts conforming to a mold or layered to near net shape, which could not previously be produced using prior art technologies. The teachings of the present invention enable production of work piece parts that are fabricated to net shape, have high strength, at a high material deposition rate, in complex shapes that include small part features, such as bosses, holes, and slots. One aspect of the innovations taught herein is to utilize a high temperature ceramic mold and deposit a molten bead of material that will flow against the mold. This can be termed "micro casting" where only a small size molten puddle is deposited at precise locations using a highly controllable electron beam heat source. Thus, various portions of any given work piece can possess molded or cast shape characteristics, while other portions can possess near net shape characteristics. None of the prior art additive manufacturing systems provides the range of benefits taught by the present invention. The present invention provides net shape deposition with minimal post processing required, utilization of high strength materials, high material deposition rates, the ability to produce complex shapes including overhangs and cavities, and small part features, such as bosses, holes, slots, and etc.

Through utilization of the teachings of the present invention, a single machine can produce multiple parts with virtually no tooling changes required. By merely adjusting the parameters in a computer aided design controller, data is changed and new parts can be created, or a part can even be modified during the middle of a production run. Long development lead times are eliminated, since part-specific tooling is not required. In applications of the present invention where a mold is employed, ceramic molds may be used that are easily machined, and that are not expensive compared to hard tooling, such as used in forgings, etc. The nature of the parts created using rapid solidification techniques in the present invention are considerably stronger than castings, which allows greater design flexibility, reduced weight and improved strength for a given part complexity. The present invention's process utilizes the same computer aided design data file repeatedly during an entire production run. The production systems and methods taught herein are readily scalable, employing a wide range of energy beam power levels and feedstock wire sizes, even allowing "bulk" deposition of materials. In another embodiment of the present invention, the material deposited to a work piece is functionally graded during the deposition process. This process involves transitioning the metal part between different alloys, or even different metals, during the layering and fabrication processes. Work piece parts are custom designed to have high strength in one area and high ductility in another. Also, parts can be fabricated with reduced weight by transitioning materials based on the finite element analysis for a particular critical load condition.

As noted hereinbefore, there are two prior art processes that employ a laser in a layered deposition process. The laser approach limits the power availability and the complexity of shapes to be deposited due to use of an optical delivery system employing lenses and mirrors, etc. Molten puddles of feedstock metals are often times highly reflective in the laser wavelengths, which prevent the efficient transfer of energy to the work piece. Prior art laser power efficiencies are in the 3% to 50% range and are not well suited to highly reflective feedstock materials. Laser power is also limited by the optical system components and laser power modulation is slow at high power settings because of the nature of laser physics. Also, a laser beam spot is difficult to modulate. With respect to powdered feedstock used in prior art systems, the powder spray used typically wastes material, and, process control parameters greatly affect bead shape, limiting control and flexibility of prior art systems. The present invention enables deposition rates in the range near 3500 cm$^3$ per hour, where prior art approaches have been limited to 500 cm$^3$ per hour or below.

In an illustrative embodiment, the present invention is applied to titanium alloy deposition, which has far reaching benefits, particularly regarding large, light weight, complex shaped, high strength parts with small features. This is made possible by creating a mold from a ceramic material and depositing feedstock alloy layer-by-layer until the entire work piece buildup is complete. A portion of the work piece conforms to the mold and a portion is layered to near net shape. Final machining operations, if needed, are significantly less that in prior art machined processes. The completed part has high mechanical and material properties, which ensures the part will pass quality-testing scrutiny. The present invention approach yields very flexible design possibilities, quick design-to-build turn-around, reduced raw material requirements, greatly reduced machining operations, higher part yields, and simplified testing procedures as compare to prior art techniques.

The methods and systems of the present invention present broad economic benefits to a wide variety of industries. Virtually all industry segments that require high strength, high temperature, and complex shaped metallic parts can benefit. At least nine major industries have been identified which span applications as diverse as the aerospace industry to the medical implant industry. Utilization of the teachings herein will reduce the dependence on a few key suppliers of large forgings, brining the investment required to manufacture parts from the hundreds of millions to the tens of millions of dollars. Because of direct deposition's inherent nature of reduced tooling, combined with the ability to deposit entire assemblies of parts instead of individual parts, the cost of traditionally assembled structure are greatly reduced. Innovations in material alloys, mobile manufacturing cells, and reduced energy consumption will keep this technology in the forefront for years to come and will keep U.S. manufacturing superior to foreign industry for the foreseeable future.

One of the core technologies of the present invention is a process called rapid solidification. The inventive deposition process uses electron beam welding equipment as the heat source and metal alloy wire as the precursor feedstock material. The electron beam has particular advantages over prior art heat sources due to its higher energy density over laser and the fact that the electron beam couples with the materials more efficiently, and can process highly reflective metals. Utilizing wire instead of powder feedstock material allows for higher deposition rates, which are up to 18 kilograms per hour, and ensures no porosity within the material deposited. Other heat sources are certainly suitable for application with the teachings herein. The selection will depend on the nature of the parts to be fabricated, the material used of fabrication, power requirements, and other variables. Suitable heat sources contemplated for application herein include ion beams, plasma beams, flame sprays, gas tungsten beams, metal arcs, gas metal arcs, microwave beams, radio frequency beams, tungsten-inert gas beams, metal-inert gas beams, and laser beams.

Figure 1:
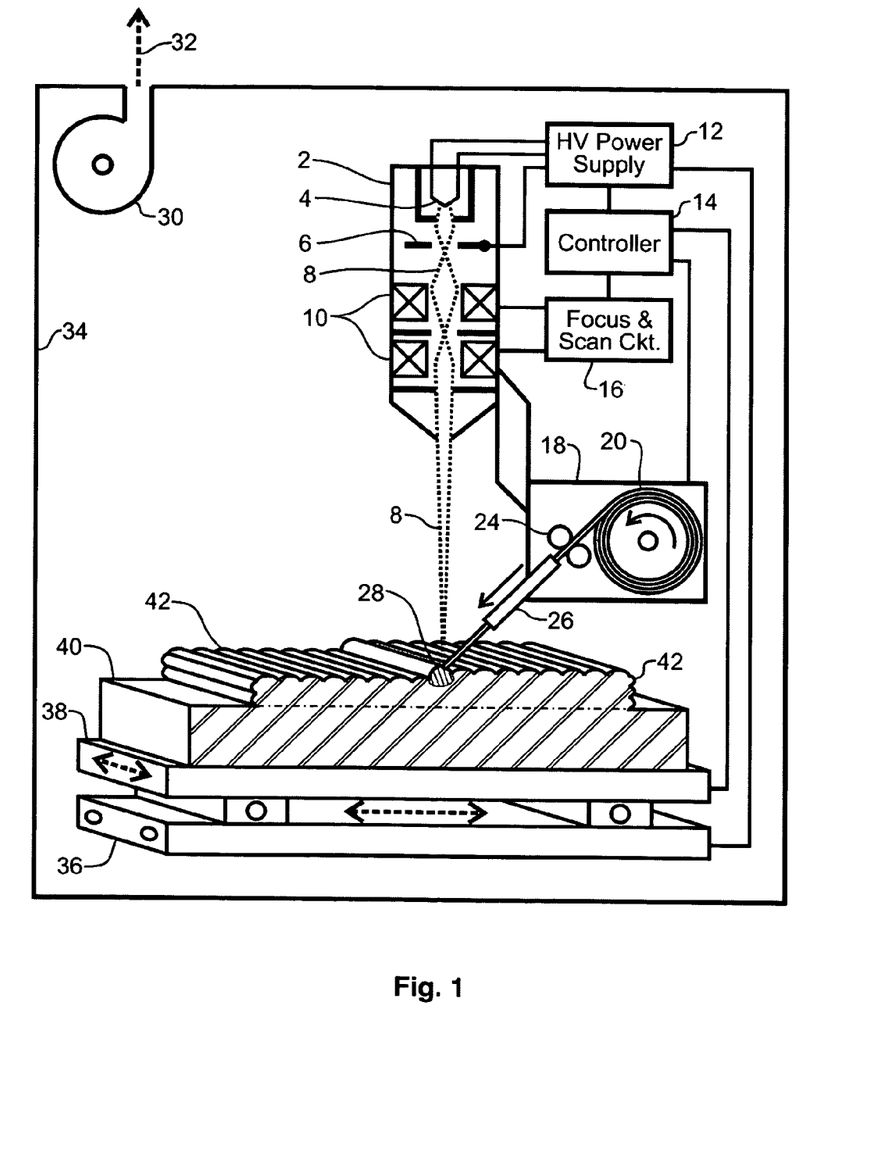
FIG. 1 is a solid freeform fabrication apparatus according to an illustrative embodiment of the present invention.

Reference is directed to FIG. 1, which is a drawing of a solid freeform fabrication system according to an illustrative embodiment of the present invention. An electron beam gun 2 is aligned to direct an electron beam 8 to a feed point 28. A feedstock drive mechanism 18 feeds feedstock 20 to the feed point 28, so that the feed point 28 results in a molten puddle of the feedstock material 28. The feedstock drive mechanism may be located inside the enclosure 34 or located outside the enclosure, sealably passing therethrough. The electron beam gun consists of a cathode 4 coupled to a high voltage power supply 12, so as to emit a stream of electrons 8. The stream of electrons 8 is accelerated toward an anode plate 6, which is also coupled to the high voltage power supply 12. A hole in the anode plate 6 allows a portion of the emitted electrons to exit as an electron beam 8. Charged coils or plates 10 focus and deflect the electron beam 8, under control of focus and scan circuit 16. The electron beam can be scanned about the feed point area 28 to control the footprint of the feed point and the size of the molten puddle 28. A programmable controller 14 coordinates the operation of the high voltage power supply 12 and the focus and scan circuits 16 so that the emitted electron beam possess the requisite energy and footprint impinging at the feed point 28. The design and structure of electron beam guns are known to those skilled in the art. With regard to the present invention, the power level and feed point 28 footprint are set to produce the needed molten puddle, which is sufficient to fuse the feedstock with the surrounding substrate material, which may be the base plate 40 material or previously deposited layers 42 of feedstock materials.

The spatial relationship of the electron beam gun 2 and feedstock drive mechanism 18 is controlled to maintain alignment of the beam 8 and feedstock 20 at the feed point 28. The feedstock drive mechanism 18 consists of a spool of feedstock materials 20, which is fed out by drive rollers 24 through guide 26 to feed point 28. The present invention contemplates a variety of feedstock materials, forms and feeding mechanism. For example, the feedstock 20 may be a powdered material that is fed to feed point 28. Or, plural fixed length straight rods of feedstock 20 may be sequentially fed from a feedstock magazine to feed point 28 by a suitable feed mechanism 18, as will be appreciated by those skilled in the art. In the illustrative embodiment, a base plate 40 is made of the same material as the feedstock 20 and is used as the base structure, although a mold is used in other illustrative embodiments. The base plate is electrically coupled to the high voltage power supply 12, so that the electron beam 8 will by attracted to the feed point 28. As the material deposition begins, the feed point 28 is positioned adjacent to the base plate 40 so the feedstock 20 initially fuses with the base plate material 40. As each subsequent layer is built up, the upper layer fuses with the next lower layer, generally referred to as the substrate that the newly deposited material 20 fuses with. The base plate 40 is rigidly coupled to a moveable stage 38, which is moveably coupled to a fixed base 36. The controller 14 is programmed to cause movement of the moveable stage within a three-dimension workspace. This enables the controller to move the feed point 28 with respect to the base plate 40 so that the work piece 40, 42 can be sequentially layered within the three-dimension workspace according to the desired net shape of the finished work piece. Those skilled in the art will appreciate that a great variety of moveable structures are suitable for use with the teachings of the present invention. A great number of drive systems, actuator, motors, guides, and structures are adaptable for programmable control of the movement between the base plate 40, or generally the base structure, and the feed point 28. There are also a wide range of industrial controllers, personal computers and other controlling devices that are suitable for use in the aforementioned control functions, as will be appreciated by those skilled in the art. In an illustrative embodiment, the controller operates using a feedback loop. The control system is able to gather data about the molten deposit puddle and change the feedstock feed rate, or energy density many times per second to control the build up rate.

The entire system illustrated in FIG. 1 operates within a sealed housing 34. A vacuum pump 30 evacuates 32 the atmosphere within the housing 34 prior to beginning the deposition and layering process. This is necessary to protect the electron beam gun 2, prevent oxidation of the feedstock 20 and work piece 42, improve energy efficiency of the systems, and other benefits, which will be appreciated by those skilled in the art. During operation, the power and footprint of the electron beam 8 at the feed point 28 is varied, as well as the feedstock 20 feed rate is varied, to accomplish the programmed deposition. The exact parameters used depend on the rate of deposition, the physical properties of the feedstock material, and the thermal properties of the materials involved, as well as the thermodynamic parameters of the system. As was discussed hereinbefore, the molten puddle at the feed point 28 undergoes rapid solidification as the feed point moves during the deposition process. Thus, the thermodynamics of the system come into play, affecting the feed rate, beam energy, and feed point movement. Base plate and support structure cooling and heating can be used to manage thermodynamics and control stress and warp in the base and structures.

In another illustrative embodiment of the present invention, a computer numerically controlled ('CNC') machine provides the controller function and drives the electron gun and feed mechanisms, coupled to a gantry assembly, along a predetermined path determined by the part being created. The substrate receives a molten pool of deposited metal that solidifies quickly to form a continuous and homogeneous layer of metal material. The deposited material is built up layer-by-layer until the entire part has been deposited as a homogeneous structure. Once a near net shape part is deposited, standard machine finishing techniques are used to machine excess material to form the final net shape.

Figure 2:
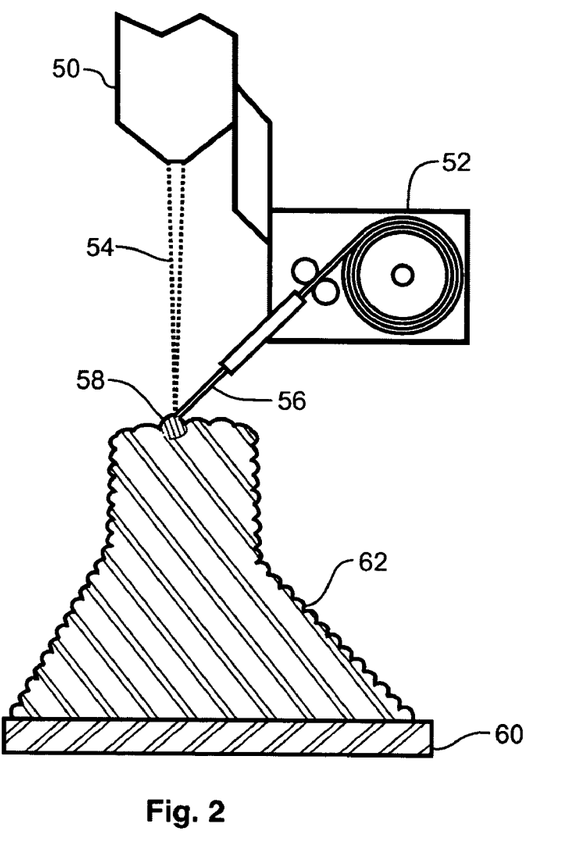
FIG. 2 is a solid freeform fabrication apparatus according to an illustrative embodiment of the present invention.
Figure 3:
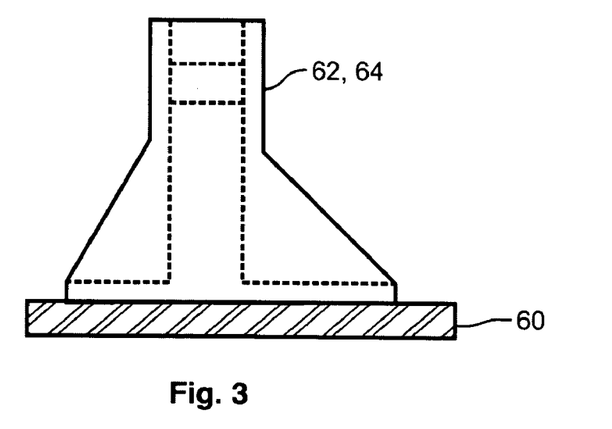
FIG. 3 is a solid freeform fabrication product according to an illustrative embodiment of the present invention.

Reference is directed to FIG. 2 and FIG. 3, which illustrate a near net shape part depositing, layering, and machining operation in accordance with an illustrative embodiment of the present invention. The electron beam gun 50 and feedstock feed mechanism 52 are coupled together and are moved within a three-dimensional space with respect to a base plate 60. The electron beam 54 and feedstock 56 converge at the feed point 58. The feedstock material is melted at the feed point 58, which is sequentially moved, depositing material that rapidly solidifies in process. The movement is programmed so that the deposited layers build to the net shape of the work piece 62 that is desired. Once the work piece 62 has reached the required near net shape, subsequent machining operations are used to reveal the finished part 64, which may include gussets, holes, bosses, slots, and etc., as required. The finished part 64 may also be separated from the base plate 60. The base plate may or may not be of the similar material as the feedstock 56.

Another advancement in the art taught by the present invention is the technique of flowing molten metal about the shape of a mold, and layering a work piece to the required size. In an illustrative embodiment, a titanium alloy containing six percent aluminum and four percent vanadium is used as a feedstock material that is layered upon a boron nitride ceramic mold. Ninety-nine percent pure boron nitride is a suitable mold material due to its high melting temperature, non reactance to metals, and ability to withstand the hard vacuum required for electron beam propagation. This material is extensively used in the molten metal handling industry and is quite well understood and readily available at favorable prices. The metal is deposited in a molten state for a brief period of time and forms a distinctive bead shape. While in the molten state, metal will flow and mix with adjacent substrate layers as surrounding metal becomes molten. Overlapping the beads allows the material to mix completely and prevents the formation of pockets, or occlusions, within the fully dense material. The ceramic mold is used to form the shape of a portion of the work piece, and the molten puddle rests against a smooth surface of the mold. Thus, the metal feedstock material will take on the shape of the mold. In a sense, this is the principle of casting, with one difference being that the metal is molten for only a short time due the rapid solidification and layering process. Thus, the mechanical properties of deposited material are greatly enhanced over that of castings. The final result is a net shape part that has the features present in the mold. Machining of the outer shape may be necessary and can be accomplished at significantly lower cost than machining the entire part from a billet.

Figure 4:
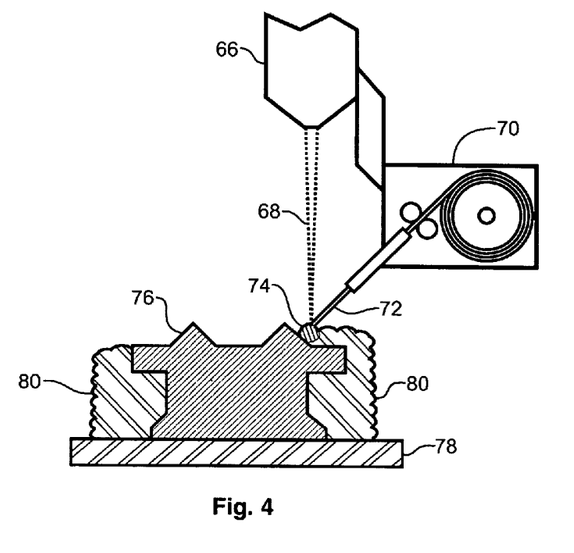
FIG. 4 is a solid freeform fabrication apparatus according to an illustrative embodiment of the present invention.
Figure 5:
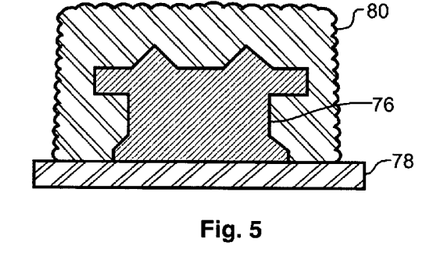
FIG. 5 is a solid freeform fabrication product according to an illustrative embodiment of the present invention.

Reference is directed to FIG. 4, which illustrates a solid freeform fabrication apparatus employing a mold according to an illustrative embodiment of the present invention. A boron nitride mold 76 is coupled to a base plate 78. An electron beam gun 66 and feedstock feed mechanism 70 are coupled together and are moved within a three-dimensional space with respect to a base plate 78 and mold 76. The electron beam 68 and feedstock 72 converge at the feed point 74. The feedstock material 72 is melted to form a molten puddle at the feed point 74, which is sequentially advanced, depositing material that rapidly solidifies in process. When adjacent to the mold 76, the molten feedstock 74 flows against the mold 76 and takes the shape thereof as the rapidly solidifying material deposition advances. The position of the feed point 74 and the base 78 and mold 76 are moved with respect to each other in the three-dimensional workspace until the deposited material 80 achieves the programmed net shape. FIG. 5 illustrates the net shape of the deposited material 80 upon completion of the layering deposition process. Note that the view in FIG. 5 is a cross section, which reveals the mold 76 within the deposited titanium alloy material 80, both of which are coupled to the base plate 78. The base plate 78 may be the same material as the deposited material 72, or may be a dissimilar material.

Figure 6:
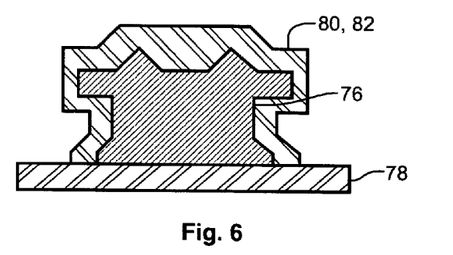
FIG. 6 is a solid freeform fabrication product according to an illustrative embodiment of the present invention.
Figure 7:
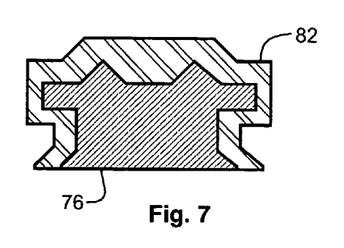
FIG. 7 is a solid freeform fabrication product according to an illustrative embodiment of the present invention.

The mold 76 in FIG. 4 and FIG. 5 illustrates some of the unique features of the present invention. Overhang portions on either side of the mold form an internal channel within the finished part, and enable a degree of complexity in the part that would otherwise be difficult and expensive to achieve using prior art machining techniques. The base plate 78 and mold 76 are moved within a three dimension workspace to relative to the feed point 74 so as to flow the feedstock material 72 onto the mold 76, and to build up the part 80 as required. Those skilled in the art will appreciate that the feed stock 72 may be directed against the mold 76 at any suitable angle to address the geometry of the mold. This allows deposition of the molten bead 74 at the optimum angle so the overhangs, slots, holes, and so forth are filled without causing or creating any shadow areas. Any three, or more, dimension drive system can be employed, including but not limited to linear drives, gantries, rotating axes, and all other drives known to those skilled in the art. The preprogrammed operation of such drives is adapted to meet the geometric characteristics of the particular mold and part being fabricated. Since the material 80 flows against the smooth surface of the mold 76, the finished part achieves the desired net shape, and little or no subsequent machining or finishing is required. Respecting the exterior of the near net shape material 80, minimal machining is required to complete the part. Reference is directed to FIG. 6, which illustrates the part 82 after the near net shape exterior 80 has undergone machining operations. The machined surface 82 and material 80 are still coupled to the base plate 78 and the mold still fills the internal void of the part 80. FIG. 7 illustrates the part 82 after it has been cut from the base plate, with the bottom surface of the mold 76 now exposed.

Figure 8:
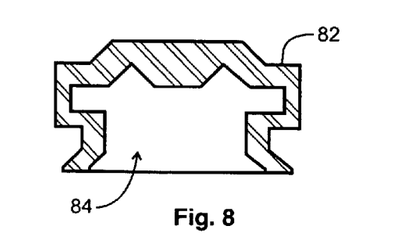
FIG. 8 is a solid freeform fabrication product according to an illustrative embodiment of the present invention.

Reference is directed to FIG. 8, which depicts the part 82, discussed respecting FIG. 6 and FIG. 7, after the mold 76 has been removed from the internal void 84. Having completed the exterior machining operations, and having separated the part 82 from the base plate 78, the removal of the mold 76 completes the part fabrication process. There are several techniques available to remove the mold form the part, the choice of which depends upon the shape of the mold and part, as well as the materials of the mold and the part. The mold and part can be relieved so that the mold is simply withdrawn from the void. The mold can be shattered by physical force, with the broken pieces removed by gravity. The mold can be chemically dissolved from the void. Those skilled in the art will appreciate other techniques known in the casting and molding arts that can be applied to the teachings of the present invention.

Figure 9:
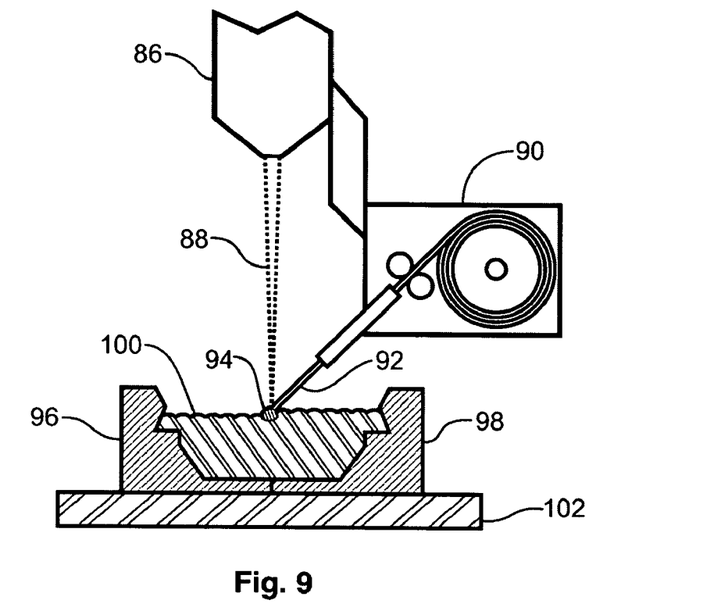
FIG. 9 is a solid freeform fabrication apparatus according to an illustrative embodiment of the present invention.
Figure 10:
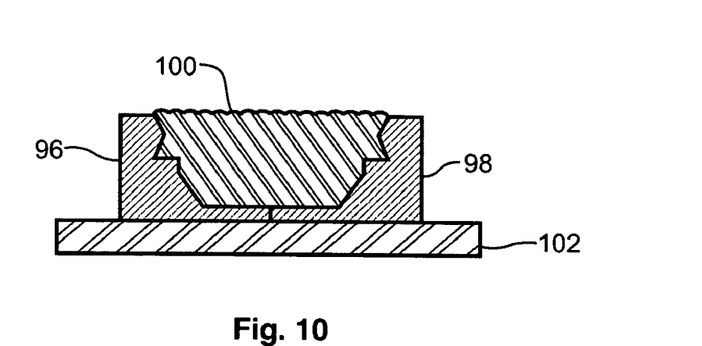
FIG. 10 is a solid freeform fabrication product according to an illustrative embodiment of the present invention.
Figure 11:
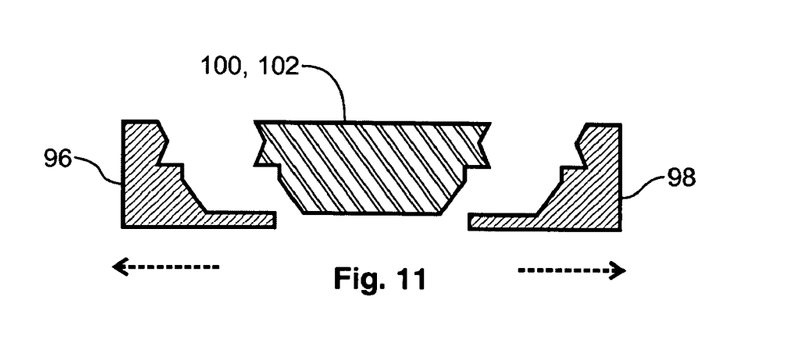
FIG. 11 is a solid freeform fabrication product according to an illustrative embodiment of the present invention.

Reference is directed to FIG. 9, FIG. 10, and FIG. 11, which depict a mold deposition technique according to an illustrative embodiment of the present invention. A split-mold 96, 98 is coupled to a base plate 102. Those skilled in the molding arts will appreciate that any of the many varieties of molds can be employed with the teachings of the present invention, including but not limited to complex molds, interlocking mechanical molds, multi segment molds, and etc. An electron beam gun 86 and feedstock feed mechanism 90 are coupled together and are moved within a three-dimensional space with respect to a base plate 102 and mold 96, 98. The electron beam 88 and feedstock 92 converge at the feed point 94. The feedstock material 92 is melted to form a molten puddle at the feed point 94, which is sequentially advanced, depositing material that rapidly solidifies in process. When adjacent to the mold 96, 98, the molten feedstock 94 flows against the mold 96, 98 and takes the shape thereof as the rapidly solidifying material deposition advances. The position of the feed point 94 and the base 102 and mold 96, 98 are moved with respect to each other in the three dimensional workspace until the deposited material 100 fills the mold 96, 98 void to the desired level. Note that in the case of an electron gun heat source, it is necessary to electrically couple the feed point and the filled material to the power supply (not shown) so that the electrons are attracted to the work piece. This can be achieved in a number of ways. The initial deposit can be made against the electrically coupled base plate 102, and the bead advanced onto the mold, thereby maintaining conductivity. The mold itself can be fabricated from a conductive material, thus maintaining conductivity. Also, an electrical conductor from the power supply can be coupled to the feed point. In another embodiment, a sacrificial ground wire or mesh provides a grounding mechanism, which is then later removed from the final part.

FIG. 10 illustrates the mold of FIG. 9 that has been layer deposited to the desired level 100. The mold halves 96, 98 remain in place atop the base plate 102. In FIG. 11, the top surface 102 of the filled material 100 has been machined to the desired specification. Also in FIG. 11, the mold haves 96, 98 have been separated from the base plate (not shown) and separated from the work piece part 100, 102. The finished part conforms to the shape of the mold. Note that the mold in the illustrative embodiment is boron nitride ceramic and the work piece is fabricated from titanium alloy. However, many other suitable materials can be employed. The critical parameter is that the mold retains its shape and surface in the presence of the heat of fabrication and the molten puddle of feedstock material. For example, a steel mold would be suitable for use with aluminum feedstock, since the melting point of steel is higher than aluminum. The present invention contemplates a great range of feedstock materials and mold materials that are suitable. Suitable feedstock materials include, but are not limited to, aluminum, an aluminum alloy, titanium, a titanium alloy, various tool steels, a carbon nanotube compounds, a composite matrixes, a various super-abrasive compounds. Suitable mold materials include, but are not limited to composite matrixes, most metals having a melting point substantially higher than the melting point of the feedstock, boron nitride, various ceramics, inorganic compounds, and graphite. Those skilled in the art will appreciate that the choice of feedstock materials and mold materials are vast, and dependent upon one another. Essentailly, the feed stock material must be able to liquefy in the presence of the energy beam and then quickly solidify, and, the mold material must hold its shape in the presence of the molten puddle without fusing to the feedstock material.

Figure 12:
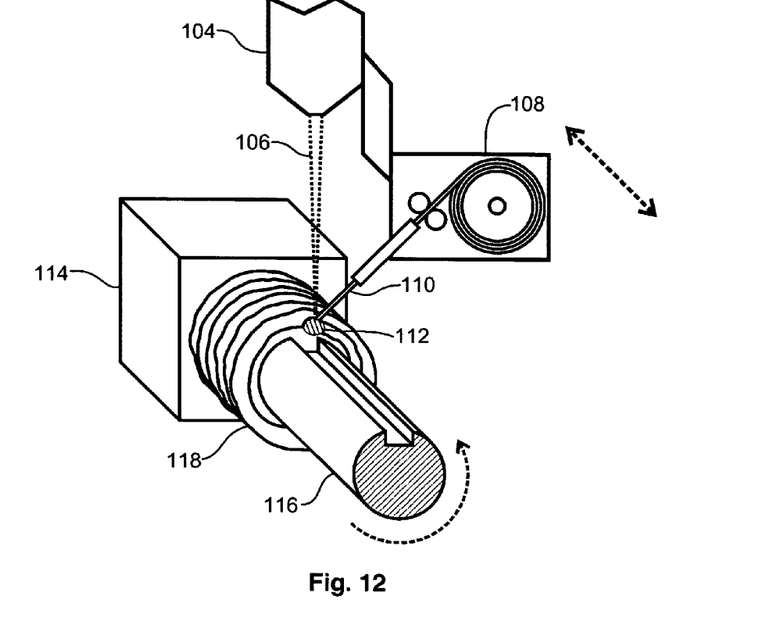
FIG. 12 is a solid freeform fabrication apparatus according to an illustrative embodiment of the present invention.
Figure 13:
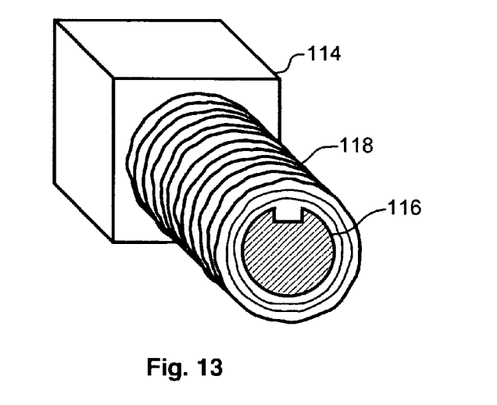
FIG. 13 is a solid freeform fabrication product according to an illustrative embodiment of the present invention.
Figure 14:
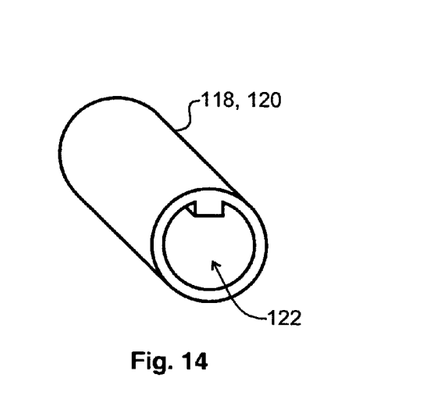
FIG. 14 is a solid freeform fabrication product according to an illustrative embodiment of the present invention.

Reference is directed for FIG. 12, FIG. 13, and FIG. 14, which depict a mold deposition technique according to an illustrative embodiment of the present invention. In FIG. 12, a mold 116 is rotated about a mandrel 114 as the deposition process commences. An electron beam gun 104 and feedstock feed mechanism 108 are coupled together and are moved linearly, parallel with the longitudinal axis of the mold 116. The electron beam 106 and feedstock 110 converge at the feed point 112. The feedstock material 110 is melted to form a molten puddle at the feed point 112, which is sequentially advanced in cylindrical fashion, depositing material 118 that rapidly solidifies in process. The newly deposited material 112 is fed in such a manner so that it is moving away from the incoming wire feedstock 110, so that if the wire 110 sticks or misses the molten puddle 112, it will glance off the part 188 rather than catch and stick. When adjacent to the mold 116, the molten feedstock 112 flows against the mold 116 and takes the shape thereof as the rapidly solidifying material deposition advances. The position of the feed point 112 is advanced along the length of the mold 116 as it rotates, building up the cylindrical part 118, layer by layer, to the desired level.

FIG. 13 illustrates the complete layered-up work piece 118 discussed respecting FIG. 12. In FIG. 13, the work piece has been layered up to the desired thickness on the mold 116, which is still coupled to the mandrel. In FIG. 14, the mold has been removed from the center of the work piece 118, revealing the void 122 inside that conforms to the desired shape. The exterior surface of the work piece 118 is machined by conventional means to the desired shape 120.

Figure 15:
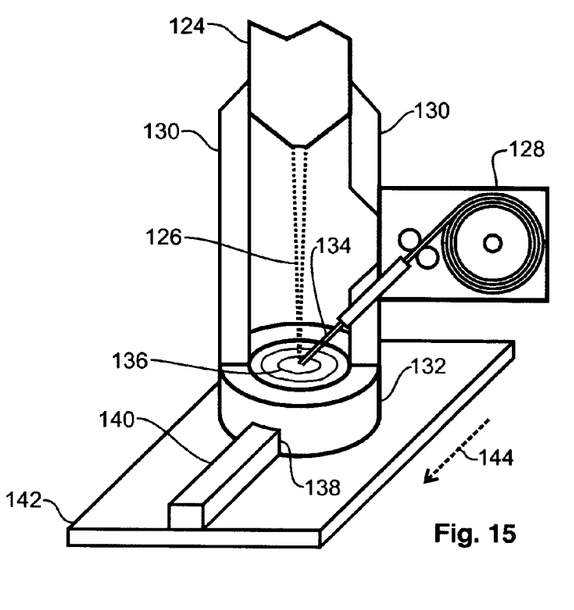
FIG. 15 is a solid freeform fabrication apparatus according to an illustrative embodiment of the present invention.

Reference is directed to FIG. 15, which illustrates an alternative embodiment of the present invention. An electron beam gun 124 is supported by supports 130 above a crucible mold 132, which has and extrusion die 138 formed therein. A feedstock feed mechanism 128 is fixed to feed feedstock 134 to a feed point 136 in the crucible 132. The electron gun 124 is fixed to align the electron beam 126 with the feed point 136, causing the feedstock material 134 to melt within the crucible 132. The assembly of the electron gun 124, feed mechanism 128 and crucible 132 are moved 144 along the plane of a base plate 142, which cause the molten feedstock material to rapidly solidify as it is extruded from the die opening 138 in the crucible 132. The power level of the electron beam 126 is selected to maintain enough energy in the crucible 132 to preserve the molten state of the material, yet still allowing the material 140 to rapidly solidify as it is extruded through the die. The molten material 136 fuses to the base plate 144 as it solidifies 140, and becomes a homogeneous part thereof. Of course, other mold-die profiles are suitable for application in this illustrative embodiment.

Figure 16:
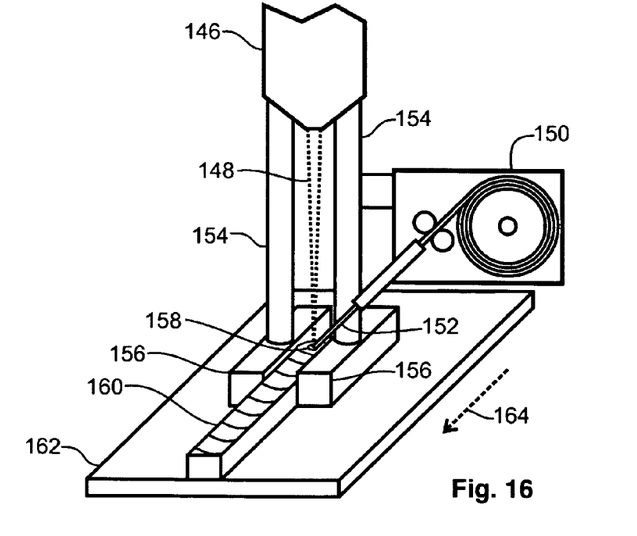
FIG. 16 is a solid freeform fabrication apparatus according to an illustrative embodiment of the present invention.

Reference is directed to FIG. 16, which illustrates an alternative embodiment of the present invention. An electron beam gun 146 is supported by supports 154 above a linear gap mold 156. A feedstock feed mechanism 150 is fixed to feed feedstock 152 to a feed point 158 between the halves of the linear gap mold 156. The electron gun 146 is fixed to align the electron beam 148 with the feed point 158, causing the feedstock material 152 to melt within the mold 156. The assembly of the electron gun 146, feed mechanism 158 and mold 156 are moved 164 along the plane of a base plate 162, which cause the molten feedstock material to rapidly solidify as it is extruded from the mold opening 156. The power level of the electron beam 148 is selected to maintain enough energy in the mold 158 to preserve the molten state of the material, yet still allowing the material 160 to rapidly solidify as it is extruded through the mold 156. The molten material 158 fuses to the base plate 162 as it solidifies 160, and becomes a homogeneous part thereof. The upper surface of the solidified material 160 can be machined to a desired dimension and finish, if desired. Of course, other mold profiles are suitable for application in this illustrative embodiment.

Figure 17:
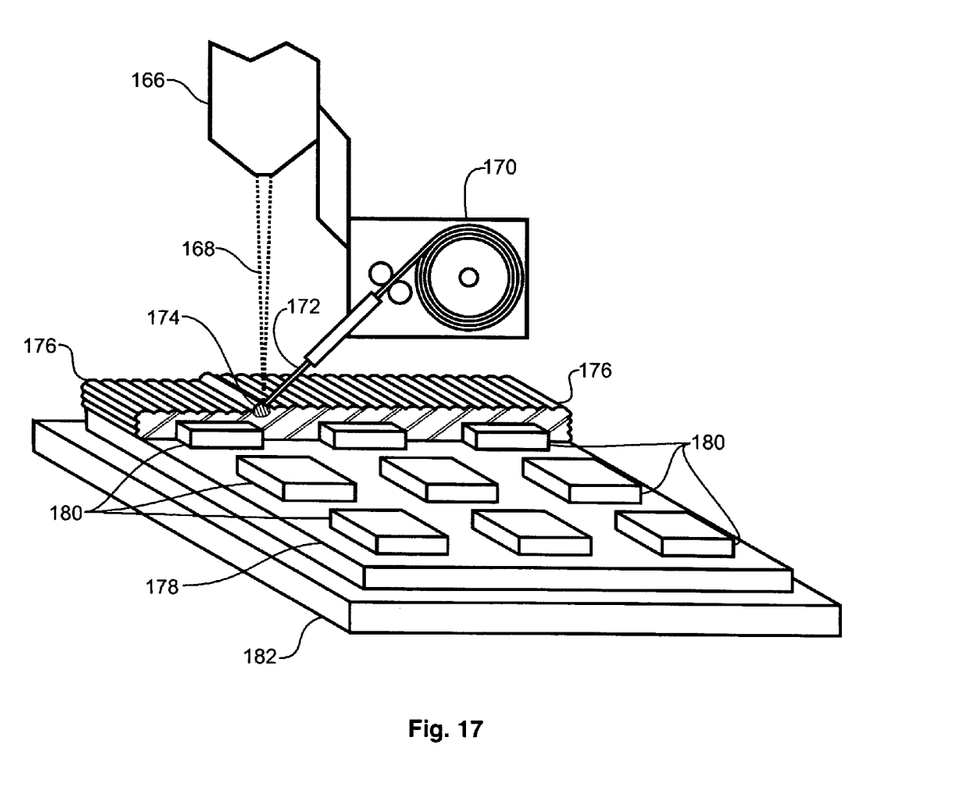
FIG. 17 is a solid freeform fabrication apparatus according to an illustrative embodiment of the present invention.

Reference is directed to FIG. 17, which depicts a mold deposition technique according to an illustrative embodiment of the present invention. A base plate supports a mold base 178, which has plural mold elements 180 disposed thereon. The mold elements 180 can be varied in shape, position and height to enable a variety of work piece 176 configurations to be realized. In an alternative embodiment, the mold elements 180 can be moved under power from a remote location, enabling adjustments to be made during the fabrication process. This process allows the realization of a progressive mold, which changes its shape as the layering process commences. The height, area, and volume of the mold elements can be changed during the deposition process. The electron beam gun 166 and feed mechanism 170 are fixed together, with the electron beam 168 and feedstock 172 directed to the work point 174. The work point 174 is moved relative to the mold 178, 180 so as to rapidly solidify the molten puddle 174 and achieve the layered deposition action in the work piece 176. Those skilled in the art will envision a variety of similar configurations employing plural mold components and elements that enable flexible manufacturing through the teachings of the present invention.

Figure 18:
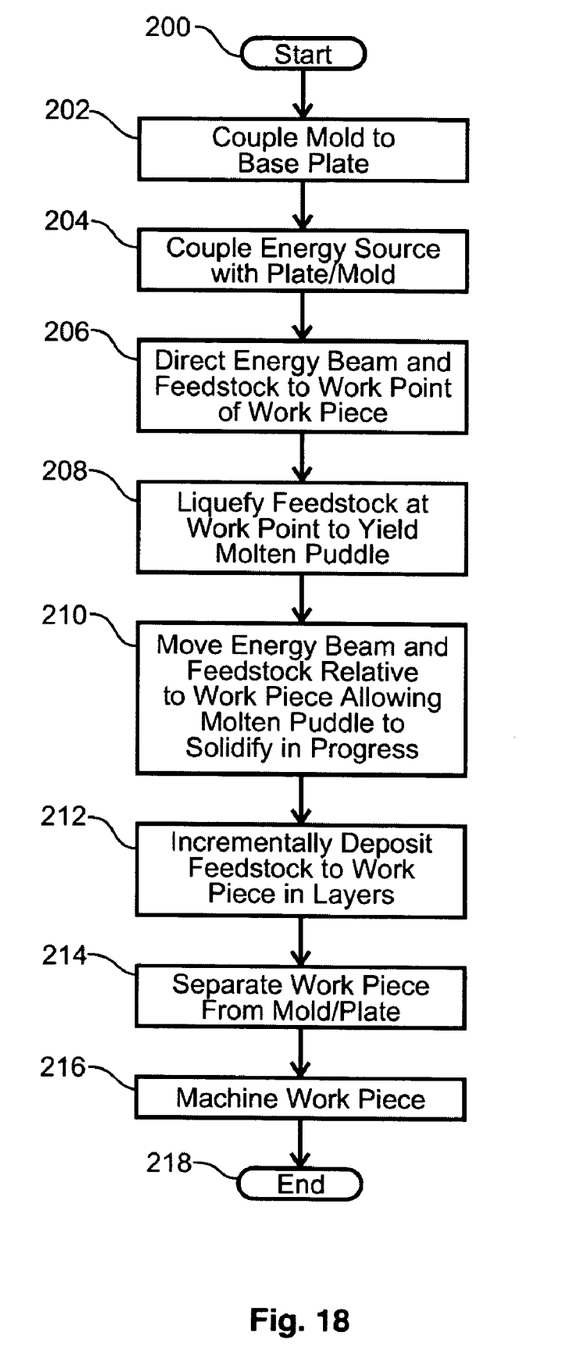
FIG. 18 is a process flow diagram according to an illustrative embodiment of the present invention.

Reference is directed to FIG. 18, which is a process flow diagram according to an illustrative embodiment of the present invention. The process generally deals with fabricating a part, or work piece, through utilization of the teachings of the present invention. The process begins at step 200 and proceeds to step 202 where a mold is coupled to a base plate or base structure in a layered deposition system. At step 204, the energy beam is directed to and coupled with the base or mold, depending on the embodiment being executed. At step 206, the energy beam and feedstock are fed to the work point in unison. This causes the feedstock to liquefy into a molten puddle and fuse with the base at step 208. At step 210, the deposition process begins as the energy beam and feedstock are fed to the feed point, which begins to move relative to the work piece. This action also causes the trailing molten puddle to rapidly solidify in the wake of the movement, as new material is fed and sequentially liquefied in the moving molten puddle. At step 212, the bulk of the material deposition occurs as the feedstock material is incrementally deposited according to a predetermined three-dimensional workspace. At step 214, the work piece is separated from the mold or base. At step 216, the work piece is machined into the desired part, as required. The process ends at step 218.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. A method of solid freefomm work piece fabrication through layered deposition of feedstock material on a mold structure, comprising the steps of:
    directing an energy beam and feeding feedstock to a feed point adjacent to the mold structure, thereby forming a molten puddle;
    moving the feed point relative to the mold structure, thereby advancing the molten puddle of presently fed feedstock and rapidly solidifying previously fed feedstock; and
    sequentially advancing the feed point within a predetermined geometric volume containing at least a portion of the mold structure, thereby sequentially fusing the feedstock, by action of the advancing molten puddle, into a near net shape work piece built-up upon the mold structure.

2. The method of claim 1 wherein said moving step further comprises the step of rotating the mold.

3. The method of claim 1 wherein said mold is fabricated from a material selected from one of; a composite matrix, a metal having a melting point substantially higher than the melting point of the feedstock, boron nitride, an inorganic compound, and graphite.

4. The method of claim 1 further comprising the step of separating the mold from the work piece.

5. The method of claim 4 further comprising the step of disintegrating the mold.

6. The method of claim 4 further comprising the step of dissolving the mold.

7. The method of claim 1 wherein said energy beam is selected from one of; an electron beam, an ion beam, a plasma beam, a flame spray, a gas tungsten beam, a metal arc, a gas metal arc, a microwave beam, a radio frequency beam, tungsten-inert gas beam, a metal-inert gas beam, and a laser beam.

8. The method of claim 1 further comprising the step of focusing the energy beam on the feed point.

9. The method of claim 1 further comprising the step of scanning the energy beam about the feed point.

10. The method of claim 1 wherein the energy beam is driven by a power supply, further comprising the step of coupling the power supply to the feedstock at the feed point.

11. The method of claim 1 wherein said method is carried out in a vacuum.

12. The method of claim 1 wherein said feedstock is a wire, further comprising the step of paying out the wire feedstock in coordination with said moving step.

13. The method of claim 1 wherein said feedstock is a powdered feedstock.

14. The method of claim 1 wherein said feedstock is selected from one of; aluminum, an aluminum alloy, titanium, a titanium alloy, a tool steel, a carbon nanotube compound, a composite matrix, a super abrasive compound.

15. The method of claim 1 further comprising the step of changing the feedstock material during said sequentially advancing step, thereby varying the metallurgical composition of the work piece.

16. The method of claim 1 further comprising the steps of gathering data about the molten puddle during said sequentially advancing step and adjusting the power level or the energy beam or the rate the feedstock is fed in response thereto.

17. The method of claim 1 further comprising the step of varying the physical dimensions of the mold during said sequentially advancing step, thereby progressively forming the mold.

18. A solid freeform fabrication system employing layered deposition of feedstock material on a mold to produce a net or near net shape work piece, comprising:
a mold support;
a feed means operable to feed feedstock material to a feed point adjacent to the mold;
an energy beam producing means operable to direct an energy beam to said feed point, thereby forming a molten puddle of feedstock material;
a movement means coupled to said mold support and operable to move said feed point relative to the mold;
a controller coupled to control movement of said movement means to advance said molten puddle of presently fed feedstock and rapidly solidify previously fed feedstock, and to sequentially advance said feed point within a predetermined geometric volume containing at least a portion of the mold, thereby sequentially fusing the feedstock, by action of said advancing molten puddle, into the near net shape work piece built-up upon the mold.

19. The system of claim 18 wherein said movement means is controllable to rotate said feed point about the mold.

20. The system of claim 18 wherein said movement means is controllable to move said feed point within a three-dimension coordinate space.

21. The system of claim 18 wherein the mold is fabricated from a material selected from one of; a composite matrix, a metal having a melting point substantially higher than the melting point of the feedstock, boron nitride, an inorganic compound, and graphite.

22. The system of claim 18 wherein the mold structure is separable from the work piece by disintegration of the mold structure.

23. The system of claim 18 wherein the mold structure is separable from the work piece by dissolving the mold.

24. The system of claim 18 wherein said energy beam producing means is selected from one of; an electron beam, an ion beam, a plasma beam, a flame spray, a gas tungsten beam, a metal arc, a gas metal arc, a microwave beam, a radio frequency beam, tungsten-inert gas beam, a metal-inert gas beam, and a laser beam.

25. The system of claim 18 wherein said controller is operable to control said energy beam producing means to focus said energy beam on said feed point.

26. The system of claim 18 wherein said controller is operable to control said energy beam producing means to scan said energy beam about said feed point.

27. The system of claim 18 further comprising a power supply coupled to said energy beam producing means, and wherein said power supply is electrically coupled to the feedstock at said feed point.

28. The system of claim 17 further comprising:
a housing for enclosing said mold support, said feed means, said energy beam producing means, and said movement means, and wherein said housing is substantially evacuated during fabrication of the work piece.

29. The system of claim 18 wherein the feedstock is a wire, and wherein said controller is operable to control said feed means to pays out the wire feedstock in coordination with said movement means.

30. The system of claim 18 wherein said feedstock is a powdered feedstock.

31. The system of claim 18 wherein said feedstock is selected from one of; aluminum, an aluminum alloy, titanium, a titanium alloy, a tool steel, a carbon nanotube compound, a composite matrix, a super abrasive compound.

32. The system of claim 18 wherein the mold is a crucible having a die formed therein, and wherein said movement means moves said crucible with respect to a base plate, thereby extruding molten feedstock through said die.

33. The system of claim 18 wherein the mold further include plural mold elements.

34. The system of claim 33 wherein said plural mold elements are adjustable in position, size, or volume while the feedstock is sequentially fused for form the work piece.

35. A solid freeform fabrication system employing layered deposition of feedstock on a mold to produce a net or near net shape work piece, comprising:
a mold support;
a boron nitride mold coupled to said mold support;
a feed means operable to feed titanium alloy wire feedstock to a feed point adjacent to the mold;
an electron beam gun operable to focus an electron beam to said feed point, thereby forming a molten puddle of said feedstock;
a power supply coupled to said electron gun, and electrically coupled to said feedstock at said feed point;
a movement means coupled to said mold support, and operable to move said feed point within a three dimension coordinate space relative to said mold;
a controller coupled to control movement of said movement means to advance said molten puddle of presently fed feedstock and rapidly solidify previously fed feedstock, and to sequentially advance said feed point within a predetermined geometric volume containing at least a portion of said mold, thereby sequentially fusing the feedstock, by action of said advancing molten puddle, into the near net shape work piece built-up upon said mold, and wherein said controller is operable to control said feed means to pays out said wire feedstock in coordination with said movement means;
a housing for enclosing said mold support, said feed means, said electron gun, and said movement means, and
a vacuum pump coupled to substantially evacuate said housing during fabrication of the work piece.

* * * * *